United States Patent
Huang et al.

(10) Patent No.: US 10,163,832 B1
(45) Date of Patent: Dec. 25, 2018

(54) INTEGRATED FAN-OUT PACKAGE, REDISTRIBUTION CIRCUIT STRUCTURE, AND METHOD OF FABRICATING THE SAME

(71) Applicant: Taiwan Semiconductor Manufacturing Co., Ltd., Hsinchu (TW)

(72) Inventors: Tzu-Yun Huang, Taipei (TW); Ming-Che Ho, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/795,281

(22) Filed: Oct. 27, 2017

(51) Int. Cl.
*H01L 23/00* (2006.01)
*H01L 25/16* (2006.01)

(52) U.S. Cl.
CPC ............. *H01L 24/08* (2013.01); *H01L 24/03* (2013.01); *H01L 25/16* (2013.01); *H01L 2224/02317* (2013.01); *H01L 2224/02331* (2013.01); *H01L 2224/02379* (2013.01); *H01L 2224/02381* (2013.01)

(58) Field of Classification Search
CPC ......... H01L 25/16; H01L 23/28; H01L 23/48; H01L 23/488; H01L 2225/06527; H01L 2225/1058; H01L 2224/023; H01L 2224/06137; H01L 2224/06147; H01L 2224/06157; H01L 2224/06167; H01L 2224/06182; H01L 2224/06187
See application file for complete search history.

(56) References Cited

U.S. PATENT DOCUMENTS

| | | | |
|---|---|---|---|
| 8,293,574 B2* | 10/2012 | Mihara | H01L 23/5389 438/107 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,754,805 B1* | 9/2017 | Yu | H01L 21/56 |
| 2007/0096306 A1* | 5/2007 | Yamagata | H01L 23/5389 257/734 |
| 2009/0020864 A1* | 1/2009 | Pu | H01L 21/561 257/687 |

(Continued)

*Primary Examiner* — Peniel M Gumedzoe
(74) *Attorney, Agent, or Firm* — JCIPRNET

(57) ABSTRACT

A redistribution circuit structure electrically connected to a die underneath is provided. The redistribution circuit structure includes a dielectric layer and a conductive layer. The dielectric layer partially covers the die, so that a conductive pillar of the die is exposed by the dielectric layer. The conductive layer is disposed over the dielectric layer and electrically connected to the die by the conductive pillar. The conductive layer includes a multilayer structure, wherein an average grain size of one layer of the multilayer structure is less than or equal to 2 μm. A method of fabricating the redistribution circuit structure and an integrated fan-out package are also provided.

19 Claims, 16 Drawing Sheets

(56) References Cited

U.S. PATENT DOCUMENTS

2015/0115442 A1\* 4/2015 Meyer-Berg ............ H01L 24/03
　　　　　　　　　　　　　　　　　　　　　257/738
2017/0103942 A1\* 4/2017 Oi ........................... H01L 24/13
2017/0141053 A1\* 5/2017 Chen ................... H01L 23/5389

\* cited by examiner

INTEGRATED FAN-OUT PACKAGE, REDISTRIBUTION CIRCUIT STRUCTURE, AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10' is a cross-sectional view illustrating the conductive via in the redistribution circuit structure.

DETAILED DESCRIPTION

Figure 1:
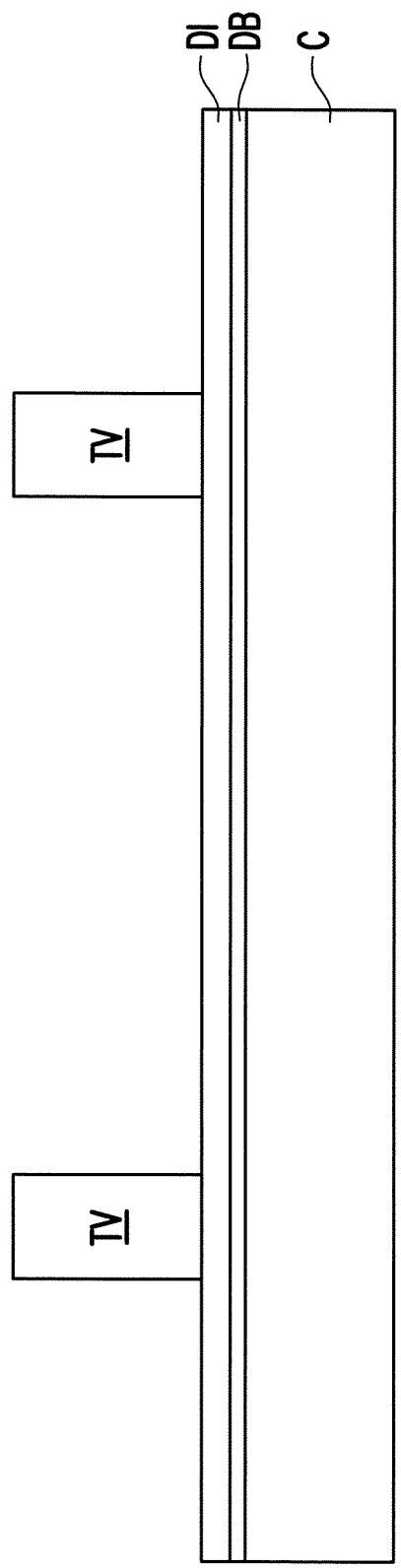
FIGS. 1 through 15 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 9:
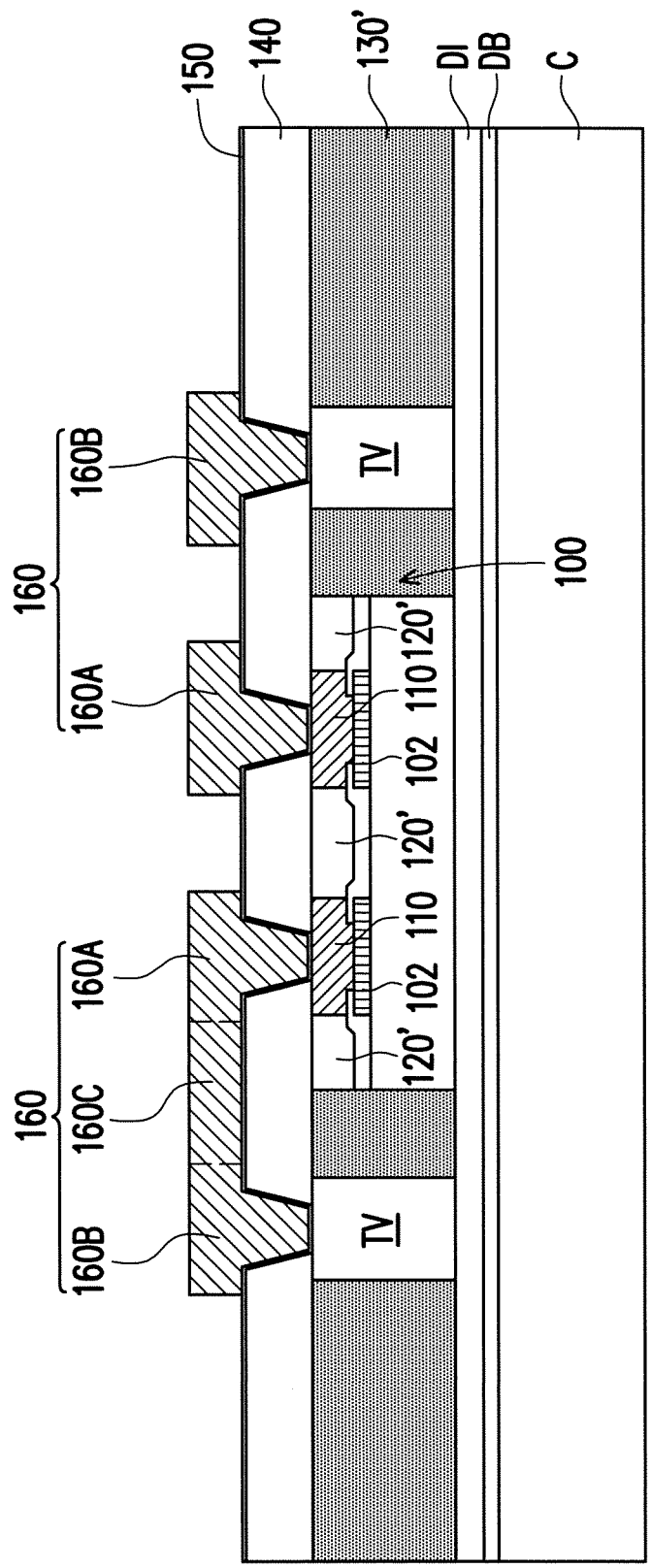
Figure 10:
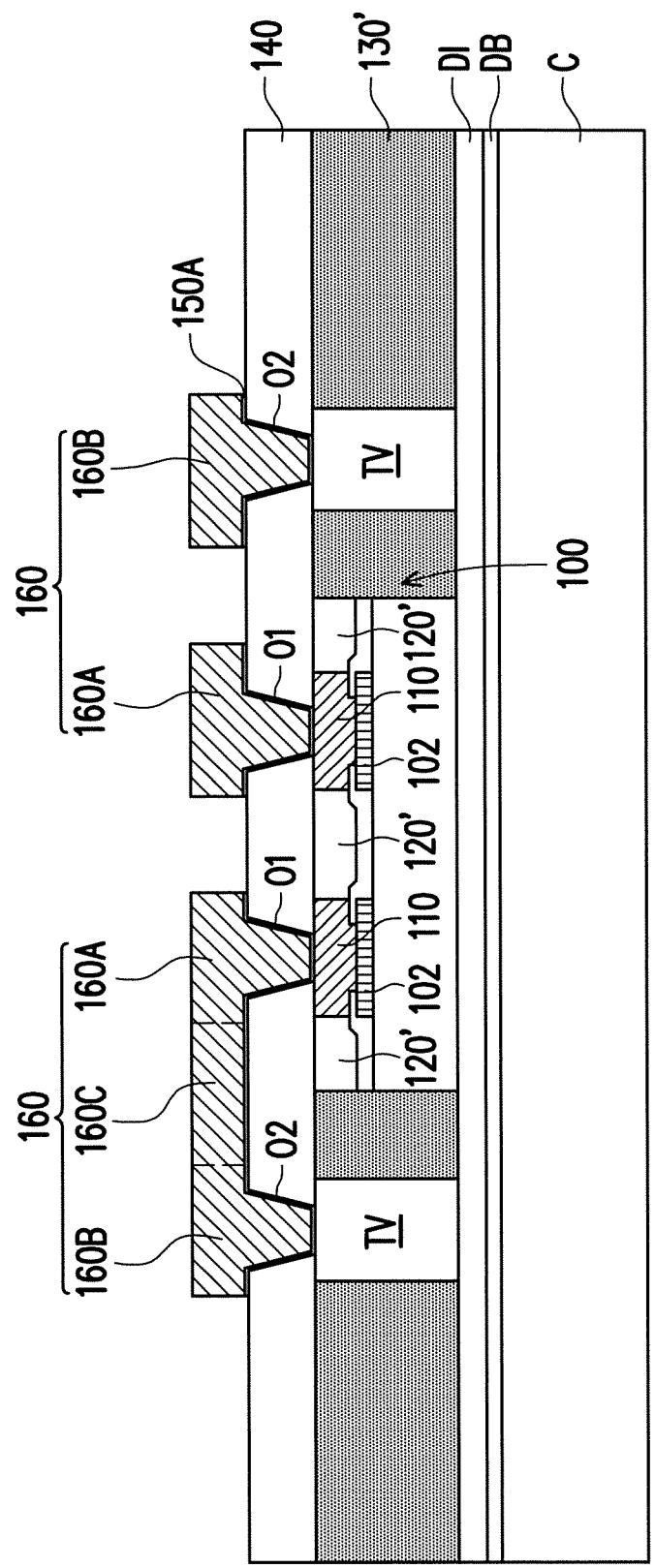
Figure 10:
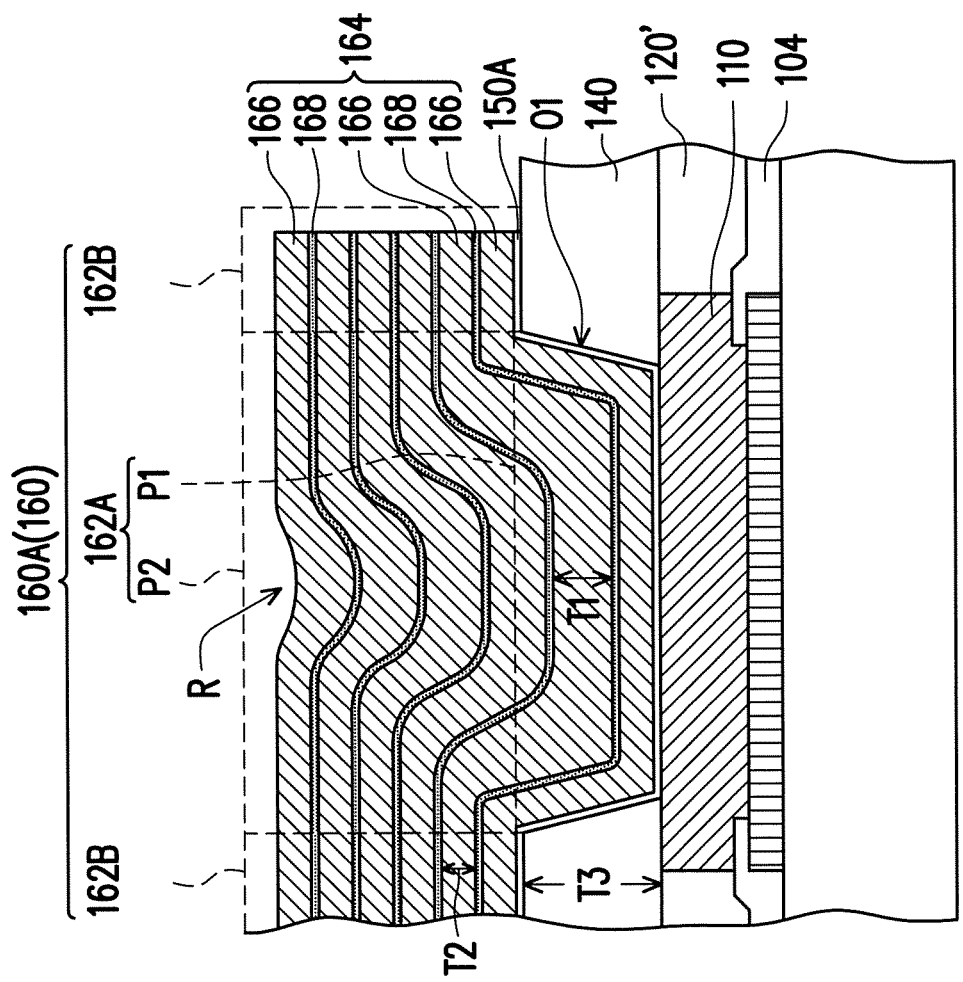

FIGS. 1 through 15 illustrate a process flow for fabricating the integrated fan-out package in accordance with some embodiments, and FIG. 10' is a cross-sectional view illustrating the conductive via in the redistribution circuit structure.

Referring to FIG. 1, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed over the glass substrate, and the dielectric layer DI is a polybenzoxazole (PBO) layer formed over the de-bonding layer DB, for example. In some alternative embodiments, the de-bonding layer DB may be a photo-curable release film whose stickiness is decreased by a photo-curing process or a thermal curable release film whose stickiness is decreased by a thermal-curing process. In some alternative embodiments, the dielectric layer DI may be a polyimide (PI) layer or other suitable dielectric layers.

After the carrier C having the de-bonding layer DB and the dielectric layer DI formed thereon is provided, a plurality of conductive through vias TV is formed over the dielectric layer DI. In some embodiments, the plurality of conductive through vias TV is formed by photolithography, plating, and photoresist stripping process. For example, the conductive through vias TV include copper posts. In some alternative embodiments, the conductive through vias TV obtained by the manufacturer may be mounted over the dielectric layer DI.

Figure 2:
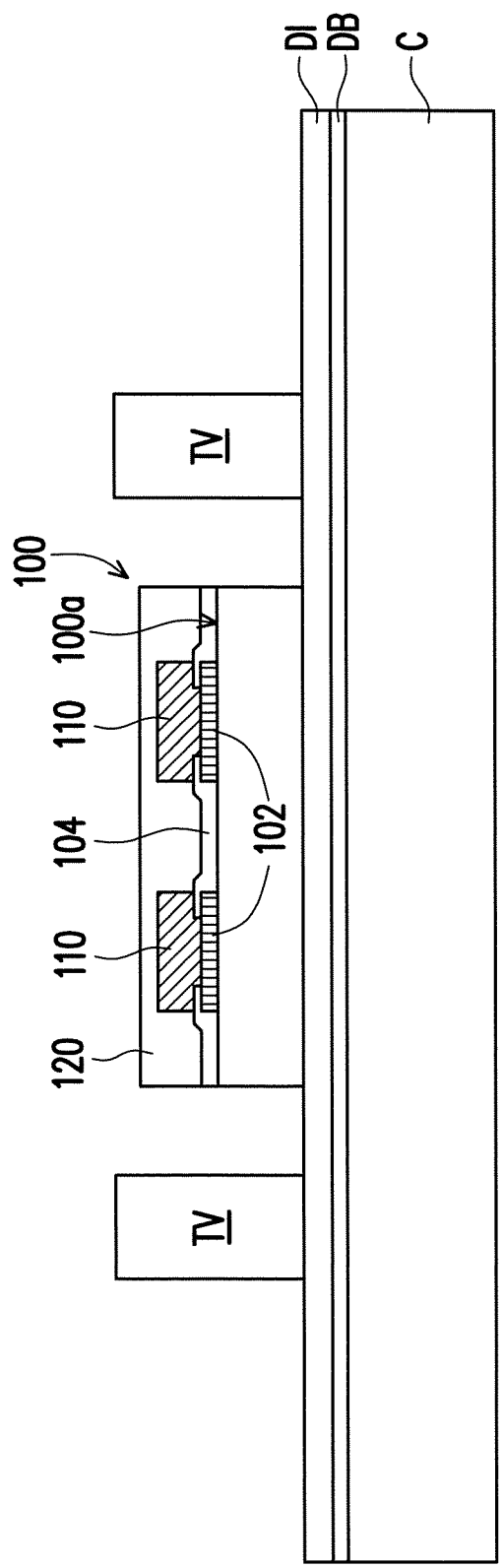

Referring to FIG. 2, a die 100 including at least one conductive pillar 110 and a protection layer 120 formed thereon is picked and placed over the dielectric layer DI. In this embodiment, a plurality of conductive pillars 110 is formed over the die 100 by photolithography, plating, and photoresist stripping process. The conductive pillars 110 are encapsulated by the protection layer 120. In some embodiments, the die 100 may include an active surface 100a. In some embodiments, the die 100 further includes a plurality of pads 102 and a passivation layer 104. The pads 102 are distributed over the active surface 100a and partially exposed by the passivation layer 104. The passivation layer 104 covers the active surface 100a of the die 100 and partially covers the pads 102. The conductive pillars 110 are formed over the pads 102 of the die 100, and the protection layer 120 covers the conductive pillars 110 and the passivation layer 104. For example, the conductive pillars 110 are plated copper pillars or other suitable metal pillars, and the passivation layer 104 is a polybenzoxazole (PBO) layer or other suitable material. As shown in FIG. 2, the top surface of the protection layer 120 is lower than the top surfaces of the conductive through vias TV, and the top surface of the protection layer 120 is higher than the top surfaces of the conductive pillars 110, for example. However, the disclosure is not limited thereto.

In some alternative embodiments, the top surface of the protection layer 120 is substantially aligned with the top surfaces of the conductive through vias TV, and the top surface of the protection layer 120 is higher than the top surfaces of the conductive pillars 110.

As shown in FIG. 1 and FIG. 2, the die 100 is picked and placed over the dielectric layer DI after the formation of the conductive through vias TV. However, the disclosure is not limited thereto. In some alternative embodiments, the die 100 is picked and placed over the dielectric layer DI before the formation of the conductive through vias TV.

Figure 3:
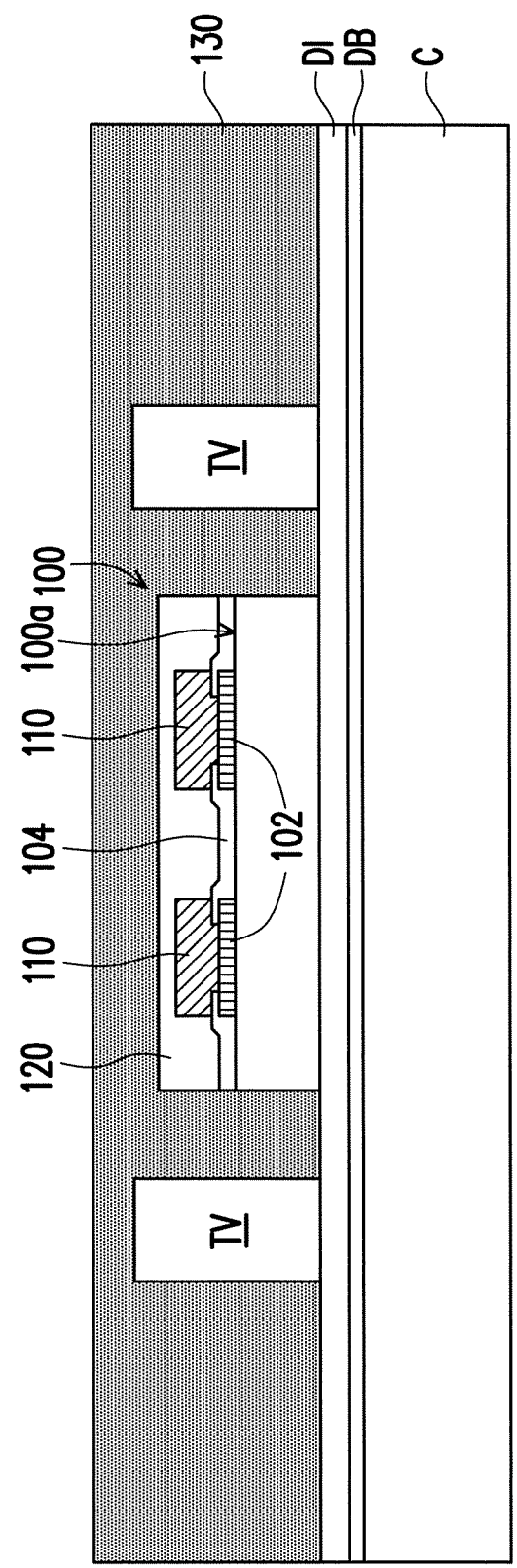

Referring to FIG. 3, an insulating material 130 is formed over the dielectric layer DI to cover the die 100 and the conductive through vias TV. In some embodiments, the insulating material 130 is a molding compound formed by molding process. The conductive pillars 110 and the protection layer 120 of the die 100 are covered by the insulating material 130. In other words, the conductive pillars 110 and the protection layer 120 of the die 100 are not revealed and are well protected by the insulating material 130 during the formation of the insulating material 130. In some embodiments, the insulating material 130 includes epoxy or other suitable resins.

Figure 4:
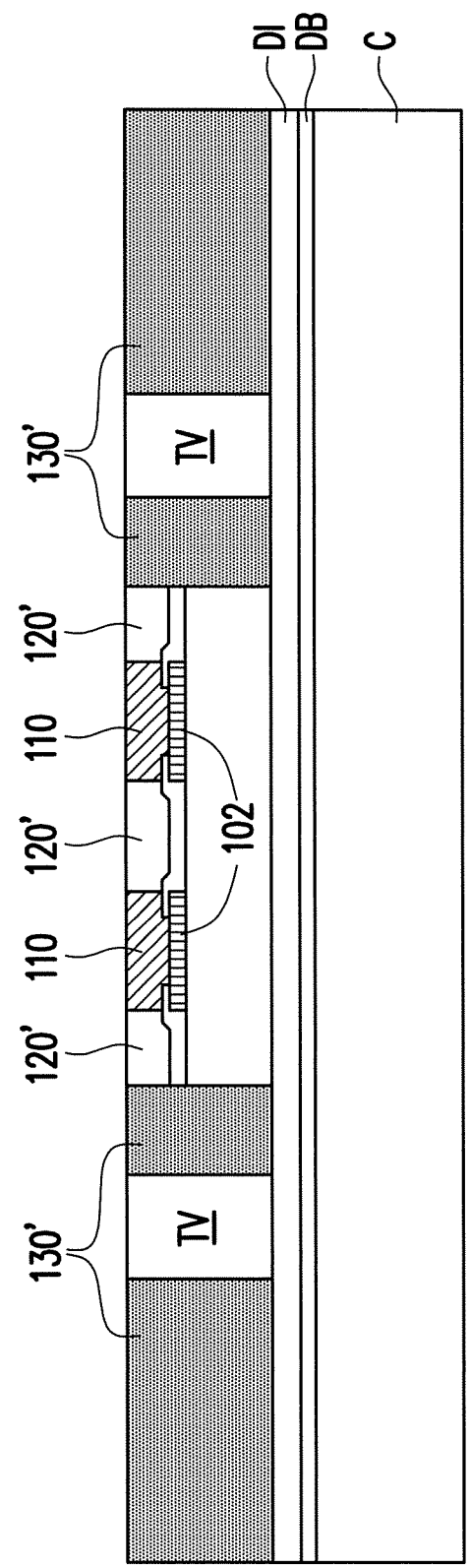

Referring to FIG. 4, the insulating material 130 is then grinded until the top surfaces of the conductive pillars 110, the top surfaces of the conductive through vias TV, and the top surface of the protection layer 120 are exposed. After the insulating material 130 is grinded, an insulating encapsulation 130' is formed. In the case, top surfaces of the conductive pillars 110 of the die 100 are exposed by the insulating encapsulation 130'. During the grinding process of the insulating material 130, portions of the protection layer 120 are grinded to form a protection layer 120'. In some embodiments, during the grinding process of the insulating material 130 and the protection layer 120, portions of the conductive through vias TV are grinded also. The insulating material 130 and the protection layer 120 are grinded through chemical mechanical polishing (CMP) process, for example. As shown in FIG. 4, in some embodiments, the top surfaces of the conductive through vias TV, the top surface of the insulating encapsulation 130', the top surfaces of the conductive pillars 110, and the top surface of the protection layer 120' are substantially coplanar.

Referring to FIG. 5 through FIG. 11, after the insulating encapsulation 130' and the protection layer 120' are formed, a redistribution circuit structure RDL (shown in FIG. 11) electrically connected to the conductive pillars 110 of the die 100 is formed over the top surfaces of the conductive through vias TV, the top surface of the insulating encapsulation 130', the top surfaces of the conductive pillars 110, and the top surface of the protection layer 120'. The redistribution circuit structure RDL (shown in FIG. 11) is fabricated to electrically connect with at least one connector underneath. Here, the afore-said connector(s) may be the conductive pillars 110 of the die 100 and/or the conductive through vias TV in the insulating encapsulation 130'. The fabrication of the redistribution circuit structure RDL (shown in FIG. 11) is described in accompany with FIG. 5 through FIG. 11 in detail.

Figure 5:
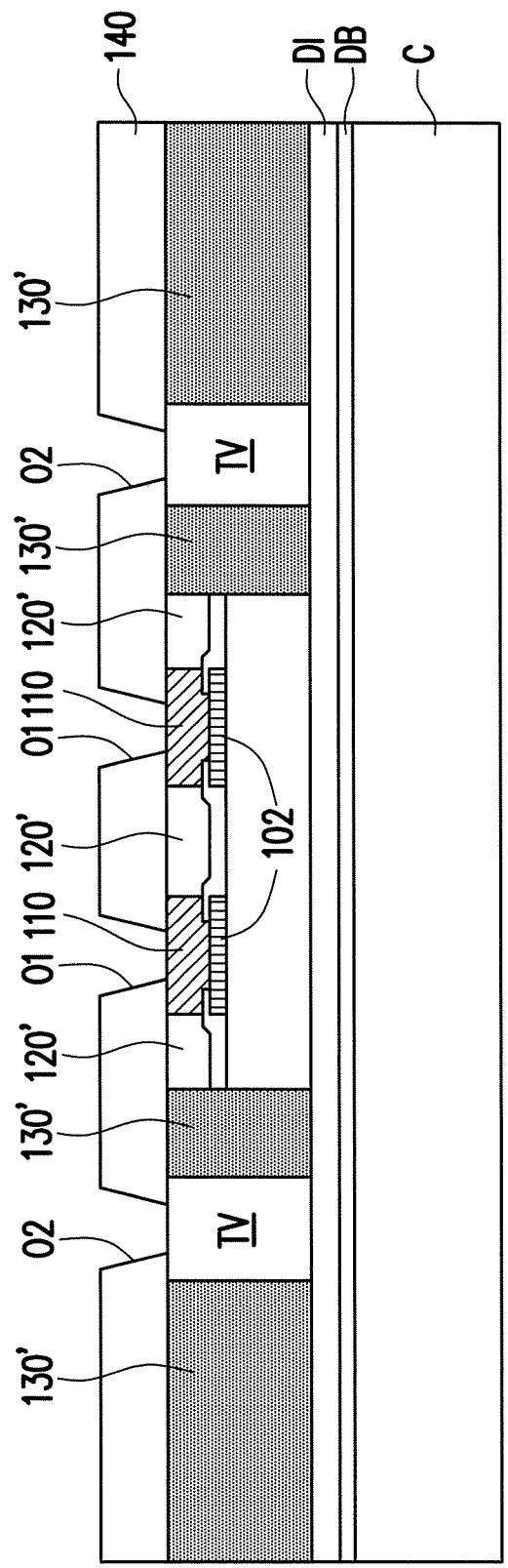

Referring to FIG. 5, a dielectric layer 140 is formed over the top surfaces of the conductive through vias TV, the top surface of the insulating encapsulation 130', the top surfaces of the conductive pillars 110, and the top surface of the protection layer 120'. The dielectric layer 140 includes at least one via hole O1 and at least one via hole O2. In this embodiment, a plurality of via holes O1 for exposing the top surfaces of the conductive pillars 110 and a plurality of via holes O2 for exposing the top surfaces of the conductive through vias TV are formed in the dielectric layer 140. It is noted that, in some embodiments, the number of the via holes O1 is corresponding to the number of the conductive pillars 110, and the number of the via holes O2 is corresponding to the number of the conductive through vias TV. In some embodiments, the dielectric layer 140 is a polymer layer such as a polybenzoxazole (PBO) layer, for example. The via hole O1 and the via hole O2 are formed by photolithography, etching, and photoresist stripping process.

Figure 6:
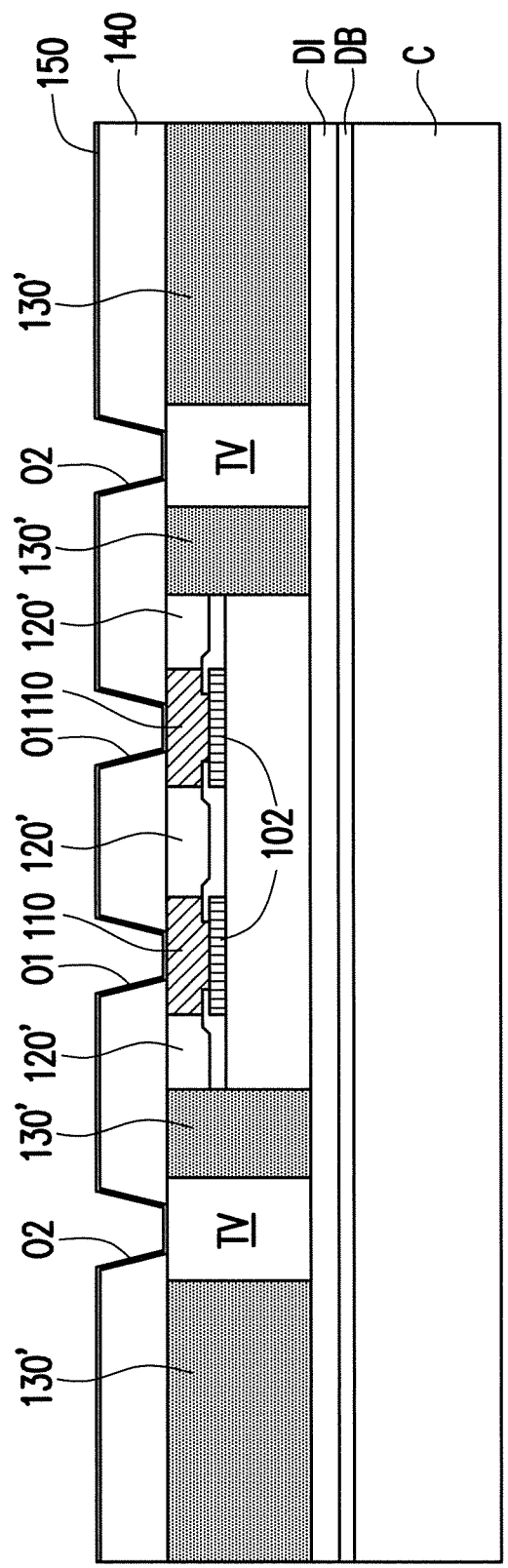

Referring to FIG. 6, after the dielectric layer 140 having the via holes O1 and the via holes O2 is formed, a seed layer 150 is sputtered, for example, over the dielectric layer 140, the top surfaces of the conductive pillars 110 exposed by the via hole O1, and the top surfaces of the conductive through vias TV exposed by the via hole O2 conformally. In some embodiments, the seed layer 150 is, for example, a titanium/copper composited layer, wherein the sputtered titanium thin film is in contact the dielectric layer 140, the top surfaces of the conductive pillars 110 exposed by the via hole O1, and the top surfaces of the conductive through vias TV exposed by the via hole O2. In addition, the sputtered copper thin film is formed over the sputtered titanium thin film. In some alternative embodiments, the seed layer 150 may be other suitable composited layer such as metal, alloy, barrier metal, or a combination thereof.

Figure 7:
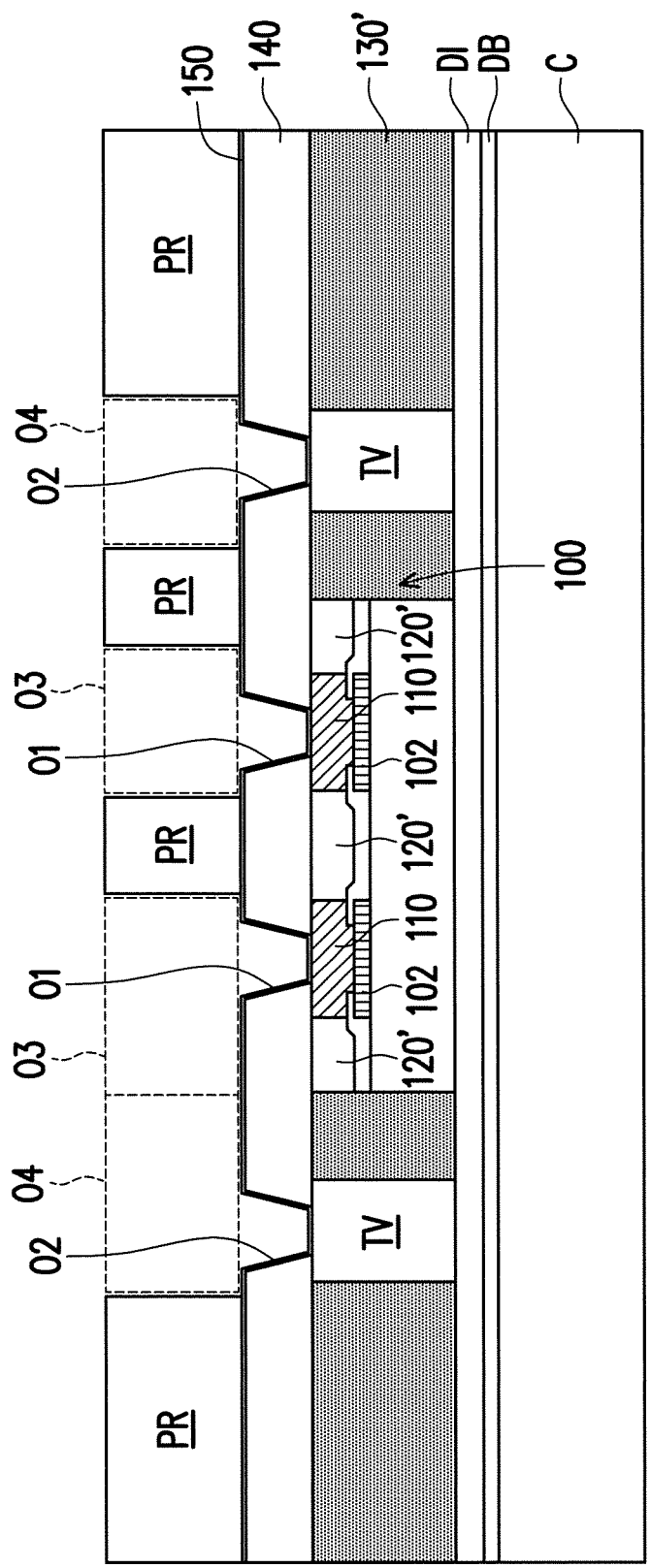

Referring to FIG. 7, a photoresist pattern PR is formed over the seed layer 150, wherein the photoresist pattern PR includes at least one opening O3 and at least one opening O4. In this embodiment, a plurality of openings O3 and a plurality of openings O4 are formed in the photoresist pattern PR. It is noted that, in some embodiments, the number of the openings O3 is corresponding to the number of the via holes O1, and the number of the openings O4 is corresponding to the number of the via holes O2. The openings O3 are located above the via hole O1, and the openings O4 are located above the via hole O2. As shown in FIG. 7, portions of the seed layer 150 are exposed by the openings O3 and the openings O4. In some embodiments, one of the openings O3 is connected to one of the openings O4. In some alternative embodiments, one of the openings O3 is separated from one of the openings O4.

Figure 8:
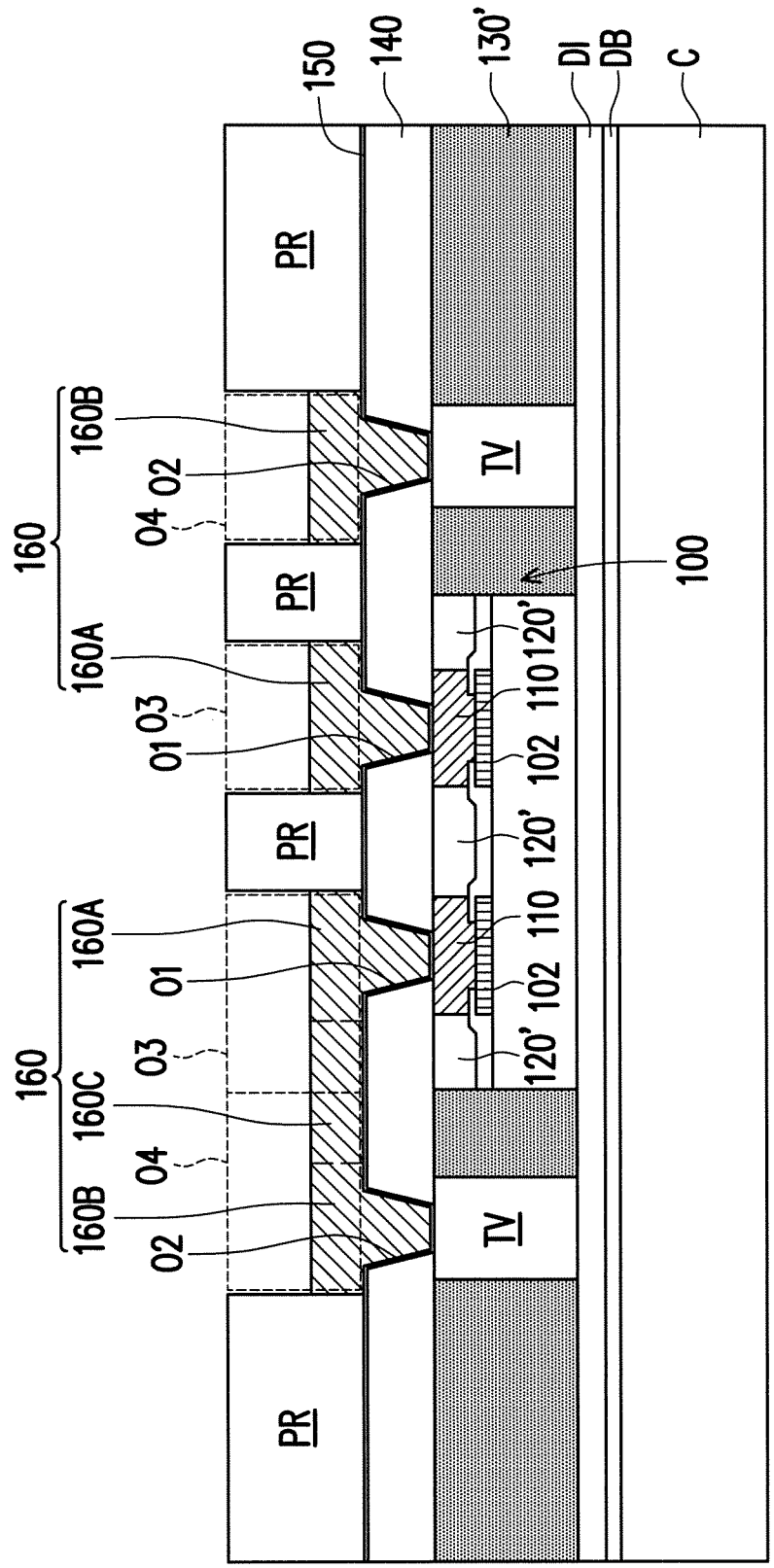

Referring to FIG. 8, after the photoresist pattern PR is formed, a plating process is performed to form a conductive layer 160 over the portions of the seed layer 150 exposed by the openings O3 and the openings O4. In some embodiments, the conductive layer 160 formed by the plating process may include a conductive via 160A formed in the via hole O1 and opening O3, a conductive via 160B formed in the via hole O2 and opening O4, and a redistribution conductive layer 160C formed between the conductive via 160A and the conductive via 160B. In some alternative embodiments, the conductive layer 160 may include a conductive via 160A formed in the via hole O1 and opening O3 and a conductive via 160B formed in the via hole O2 and opening O4, wherein the conductive via 160A and the conductive via 160B are separated from each other. The conductive via 160A is connected to the conductive pillar 110 of the die 100 through the via hole O1. The conductive via 160B is connected to the conductive through vias TV through the via hole O2. In this embodiment, a plurality of conductive vias 160A and conductive vias 160B are plated over the portions of the seed layer 150 exposed by the photoresist pattern PR. It is noted that, in some embodiments, the number of the conductive vias 160A is corresponding to the number of the conductive pillar 110, and the number of the conductive vias 160B is corresponding to the number of the conductive through vias TV.

As shown in FIG. 8, the conductive vias 160A are plated over portions of the seed layer 150 that are exposed by the opening O3, and the conductive vias 160B are plated on portions of the seed layer 150 that are exposed by the opening O4. The conductive vias 160A are formed above the conductive pillars 110, and the conductive vias 160B are formed above the conductive through vias TV.

In some embodiments, the plating process for forming the conductive layer 160 may include a single plating step, two plating steps, or multi plating steps. Take the single plating step for example, the plating density of the single plating step may be in a range of 0.5 amperes per square decimeter (ASD) to 2 ASD, so that the conductive vias 160A are formed in the openings O3; while the conductive vias 160B are formed in the openings O4. In some embodiments in which the conductive layer 160 is formed by two plating steps, a first plating process is performed to form a first plated conductive layer over the seed layer 150 exposed by the openings O3 and the openings O4, and a second plating process is then performed to form a second plated conductive layer over the first plated conductive layer. The first plating process and the second plating process are performed at different process parameters such as various plating densities. It is noted that, in some exemplary embodiments, the first plating process is performed at higher plating density (e.g., greater than 2 ASD), and the second plating process is performed at lower plating current density (e.g., less than 2 ASD). On the contrary, in some other exemplary embodiments, the first plating process is performed at lower plating current density (e.g., less than 2 ASD), and the second plating process is performed at higher plating density (e.g., greater than 2 ASD). In some alternative embodiments, the plating process includes more than two plating steps, and more than two stacked and plated conductive layers are formed over the seed layer 150.

Referring to FIG. 9, after the plating process is performed, the photoresist pattern PR is stripped such that portions of the seed layer 150 that are not covered by the conductive layer 160 are exposed. The photoresist pattern PR may be removed by a dry strip, a wet strip or a combination thereof.

Referring to FIG. 10, by using the conductive layer 160 as hard masks, the portions of the seed layer 150 uncovered by the conductive layer 160 are removed so as to form a patterned seed layer 150A. In some embodiments, the patterned seed layer 150A is formed between the conductive pillar 110 of the die 100 and the conductive vias 160A of the conductive layer 160. In some alternative embodiments, the patterned seed layer 150A is formed between the conductive through via TV and the conductive vias 160B of the conductive layer 160. In some embodiments, the seed layer 150 is patterned by etching until the dielectric layer 140 is exposed.

Referring to FIGS. 10 and 10', the conductive layer 160 (e.g., the conductive vias 160A, 160B, and the redistribution conductive layer 160C) formed by the plating process may be a multilayer structure 164. Take the conductive via 160A for example, the multilayer structure 164 includes a plurality of conductive sublayers 166 stacked to each other along a direction perpendicular to a top surface of the conductive pillar 110 of the die 100, as shown in FIG. 10'. In some alternative embodiments, the multilayer structure 164 further includes interlayers 168. The interlayer 168 is between adjacent two conductive sublayers 166. The content of the conductive sublayer 166 and that of the interlayer 168 are similar, but not the same. In some embodiments, the conductive sublayer 166 includes metal, such as Cu, Al or a combination thereof. The interlayer 168 includes metal, such as Cu, Al or a combination thereof and further include some impurities therein. The impurities may include C, N, O, S, Cl, or a combination thereof. That is, the metal content of the interlayer 168 is less than the metal content of conductive sublayers 166. In other words, the impurity content of the interlayer 168 is greater than the impurity content of conductive sublayers 166. In other embodiments, the multilayer structure 164 may include at least two layers. An average grain size of a top layer of the at least two layers is greater than an average grain size of a bottom layer of the at least two layers.

In addition, the conductive via 160A includes a main body portion 162A and a sidewall portion 162B connected to the main body portion 162A. The main body portion 162A is disposed in the first via hole O1 and protrudes from the top surface of the dielectric layer 140. The sidewall portion 162B is disposed on an upper sidewall of the main body portion 162A and disposed over the dielectric layer 140 (i.e., out of the first via hole O1). In detail, the main body portion 162A includes a first portion P1 and a second portion P2 disposed over the first portion P1. The first portion P1 of the main body portion 162A fills up the via hole O1. The sidewall portion 162B is disposed over the dielectric layer 140 and laterally aside and connected to the second portion P2 of the main body portion 162A. From the cross-section view of FIG. 10', the conductive via 160A is formed as T-shape. A level height difference exists between a bottom surface of the main body portion 162A and a bottom surface of the sidewall portion 162B. In some exemplary embodiments, a local current density at a center region of the first via hole O1 is higher than a local current density at an edge region of the first via hole O1 (or a region out of the first via hole O1) during the plating process, so that an average grain size of the main body portion 162A is greater than an average grain size of the sidewall portion 162B. The average grain size of the main body portion 162A may be in a range of 1.5 µm to 2 µm, such as 1.6 µm, 1.7 µm, 1.8 µm, or 1.9 µm. The average grain size of the sidewall portion 162B may be in a range of 0.8 µm to 1.2 µm, such as 0.9 µm, 1.0 µm, or 1.1 µm. It is noted that, in some embodiments, an average grain size of one layer of the conductive sublayers 166 of the multilayer structure 164 is less than or equal to 2 µm. Compare with the average grain size greater than 2 µm, the multilayer structure 164 with the smaller average grain size has higher tensile strength (e.g., greater than 289 Mpa) and larger elongation (e.g., greater than 30%) to endure the stress from coefficient of thermal expansion (CTE) mismatch between the dielectric layer 140 and the multilayer structure 164. Therefore, the crack issue of the conductive layer is avoided after thermal cycling or reliability test, especially the crack issue of a plurality of multilayer structures 164 stacked alternately.

The thicknesses T1 of the conductive sublayers 166 of the multilayer structure 164 at the main body portion 162A may be the same or different. The thickness T2 of the conductive sublayers 166 of the multilayer structure 164 at the sidewall portion 162B are the same or different. In a same conductive sublayer 166, a thickness T1 of the conductive sublayer 166 of the main body portion 162A is greater than a thickness T2 of the conductive sublayer 166 of the sidewall portion 162B. In other words, the conductive sublayers 166 are not conformal layers. The interlayers 168 may be conformal layers or not. The thickness T1 of the conductive sublayer 166 at the main body portion 162A is in a range of 1.5 μm to 2 μm, and the thickness T2 of the conductive sublayer 166 of the multilayer structure 164 at the sidewall portion 162B is in a range of 0.8 μm to 1.2 μm. The smaller the thickness T1 or T2 of the conductive sublayer 166, the more the layer number of the conductive sublayer 166. In some embodiments, the layer number of conductive sublayers 166 may be larger than or less than 6 depending on actual design needs.

Further, since the level height difference exists between the bottom surface of the main body portion 162A and the bottom surface of the sidewall portion 162B and the plating density of the plating process is less than 2 ASD, the conductive sublayers 166 of the multilayer structure 164 are formed and extending along surfaces of the dielectric layer 140 and the first via hole O1 and the thicknesses T2 and T1 are smaller than a thickness T3 of the dielectric layer 140. From the cross-section view of FIG. 10', the conductive sublayer 166 and the interlayer 168 at the main body portion 162A have a U shape, respectively. Each conductive sublayer 166 at the main body portion 162A has a recess R. The width and the depth of the recess R are decreased from bottom to top. In some embodiments, the top surface of the topmost conductive sublayer 166 at the main body portion 162A still has the recess R thereon. In other words, a top surface of the main body portion 162A is lower than a top surface of the sidewall portion 162B. The top surface of the topmost conductive sublayer 166 is an uneven surface. In some alternative embodiments, the top surface of the topmost conductive sublayer 166 is a planar surface. In other words, the top surface of the main body portion 162A and the top surface of the sidewall portion 162B are coplanar.

Similarly, in some embodiments, the conductive via 160B can also be a multilayer structure including a plurality of conductive sublayers stacked alternately along the direction perpendicular to a top surface of the conductive through via TV. The average grain size of the conductive sublayers of the multilayer structure is less than or equal to 2 μm.

Figure 11:
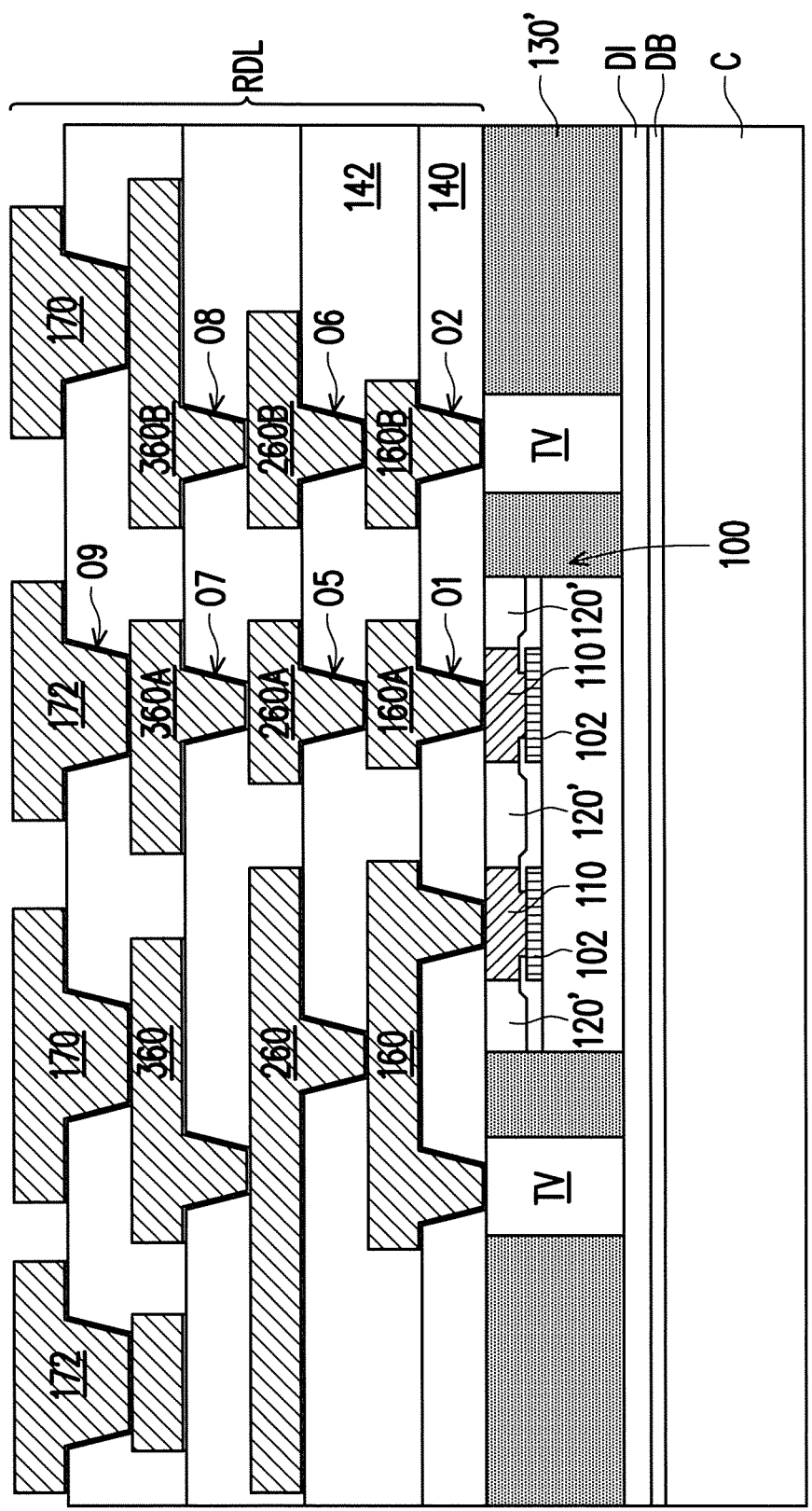

Referring to FIG. 11, after the dielectric layer 140 and the conductive layer 160 are formed, steps illustrated in FIG. 5 through 10 can be repeated at least one time so as to fabricate the redistribution circuit structure RDL over the die 100 and the insulating encapsulation 130'. In detail, another dielectric layer 142 is formed over the dielectric layer 140 and the conductive layer 160. The another dielectric layer 142 includes a plurality of via holes O5 and O6 exposing a portion of a top surface of the conductive layer 160. Another seed layer (not shown) is formed over the another dielectric layer 142. The another seed layer covers the via holes O5 and O6 and the portion of the top surface of the conductive layer 160. Another photoresist pattern (not shown) is formed over the another seed layer. The another photoresist pattern includes a plurality of photoresist openings (not shown) corresponding to the via holes O5 and O6. Another plating process is performed to form another conductive layer 260 (including conductive vias 260A and 260B) in the via holes O5 and O6. The another conductive layer 260 is electrically connected to the conductive layer 160. The another photoresist pattern is removed. The another seed layer uncovered by the another conductive layer 260 is removed by using the another conductive layer 260 as hard masks. The foregoing steps are repeated to form the redistribution circuit structure RDL including a plurality of dielectric layers and a plurality of conductive layers stacked alternately.

In some embodiment, the topmost patterned conductive layer of the redistribution circuit structure RDL may include a plurality of under-ball metallurgy (UBM) patterns 170 for electrically connecting with conductive balls and/or at least one connection pad 172 for electrically connecting with at least one passive component or external component. In this embodiment, a plurality of UBM patterns 170 and a plurality of connection pads 172 are formed. The number of the UBM patterns 170 and the connection pad 172 is not limited in this disclosure.

It is noted that, in some embodiments, the number of the conductive layer of the redistribution circuit structure RDL is plural. In some embodiments, a plurality of conductive layers are stacked to each other. As shown in FIG. 11, the conductive vias 160A, 260A, 360A, and the connection pad 172 are stacked to each other, for example. In detail, the via holes O1, O5, O7, and O9 are corresponding to the conductive pillars 110 of the die 100, so that the conductive vias 160A, 260A, 360A, and the connection pads 172 formed in the via holes O1, O5, O7, and O9 are aligned with each other.

In some embodiments, the plating density for forming the lower conductive layer (i.e. the conductive via 160A) may be smaller than that of the upper conductive layer (i.e. the topmost connection pad 172, the conductive via 360A of the conductive layers 360, or the conductive via 260A of the conductive layers 260) with respect to a direction perpendicular to the top surface of the conductive pillar 110 of the die 100. In some exemplary embodiments, the plating density for forming a bottommost conductive via 160A of the conductive layers 160 is less than the plating density for forming a topmost connection pad 172 of the conductive layers. In some other exemplary embodiments, the plating density for forming the conductive layers of the redistribution circuit structure RDL gradually increases from bottom (i.e. the conductive via 160A) to up (i.e. the connection pad 172). In some embodiments, the plating density for forming the conductive via 160A of the conductive layers 160 may be in a range of 0.5 ASD to 2 ASD, for example. The plating density for forming the connection pad 172 of the conductive layers may be in a range of 3 ASD to 10 ASD, for example.

The average grain size of the lower conductive layer (i.e. the conductive via 160A of the conductive layers 160) may be smaller than the average grain size of the upper conductive layers (i.e. the topmost connection pad 172, the conductive via 360A of the conductive layers 360, or the conductive via 260A of the conductive layers 260) with respect to a direction perpendicular to the top surface of the conductive pillar 110 of the die 100. In some exemplary embodiments, the average grain size of the bottommost conductive via 160A of the conductive layers 160 is less than the average grain size of the topmost connection pad 172. In some other exemplary embodiments, the average grain size distribution of the conductive layers of the redistribution circuit structure RDL gradually increases from bottom (i.e. the conductive via 160A) to up (i.e. the connection pad 172). In some embodiments, the average grain size of the conductive via 160A of the conductive layers 160 may be smaller than 2 μm, for example. The the average grain size of the connection pad 172 of the conductive layers may be in a range of 2 μm to 3 μm, for example.

Further, since the lower conductive layer (i.e. the conductive via 160A of the conductive layers 160) has the average grain size smaller than that of the upper conductive layer (i.e. the topmost connection pad 172, the conductive via 360A of the conductive layers 360, or the conductive via 260A of the conductive layers 260), the lower conductive layer (i.e. the conductive via 160A of the conductive layers 160) has higher tensile strength and larger elongation than the upper conductive layer (i.e. the topmost connection pad 172, the conductive via 360A of the conductive layers 360, or the conductive via 260A of the conductive layers 260). In some embodiments, in the redistribution circuit structure RDL, the tensile strength and elongation distribution of the conductive layers gradually increases from the topmost conductive layer (i.e. the topmost connection pad 172) to the bottommost conductive layer (i.e. the conductive via 160A of the conductive layers 160).

On the other hand, in some embodiments in which the conductive layers of the redistribution circuit structure RDL have substantially the same thickness, since the lower conductive layer has the average grain size and the thickness smaller than those of the upper conductive layer, the layer number of conductive sublayers of the lower conductive layer (i.e. the conductive via 160A of the conductive layers 160) is greater than that of the conductive sublayers of the upper conductive layer (i.e. the topmost connection pad 172, the conductive via 360A of the conductive layers 360, or the conductive via 260A of the conductive layers 260). In some embodiments, in the redistribution circuit structure RDL, the layer number of the conductive sublayers in the conductive layer gradually decreases from the bottommost conductive layer (i.e. the conductive via 160A) to the topmost conductive layer (i.e. the connection pad 172).

In some alternative embodiments, the plating density, the average grain size, and the layer number of the conductive sublayer of the upper conductive layer (i.e. the topmost connection pad 172, the conductive via 360A of the conductive layers 360, or the conductive via 260A of the conductive layers 260) may be equal to the plating density (e.g., smaller than 2 ASD) and the average grain size (e.g., smaller than 2 μm), and the layer number of the conductive sublayer of the lower conductive layer (i.e. the conductive via 160A of the conductive layer 160).

Similarly, the via holes O2, O6, and O8 are corresponding to the conductive through via TV, so that the conductive vias 160B, 260B, and 360B formed in the via holes O2, O6, and O8 are aligned with each other. Accordingly, the average grain size of the conductive via (i.e. the conductive via 160B) of the lower conductive layer is less than or equal to the average grain size of the conductive via (i.e. conductive vias 360B or 260B) of the upper conductive layers with respect to a direction perpendicular to the top surface of the conductive through via TV. As shown in FIG. 11, in some alternative embodiments, the UBM pattern 170 may not align with the conductive via 160B.

Figure 12:
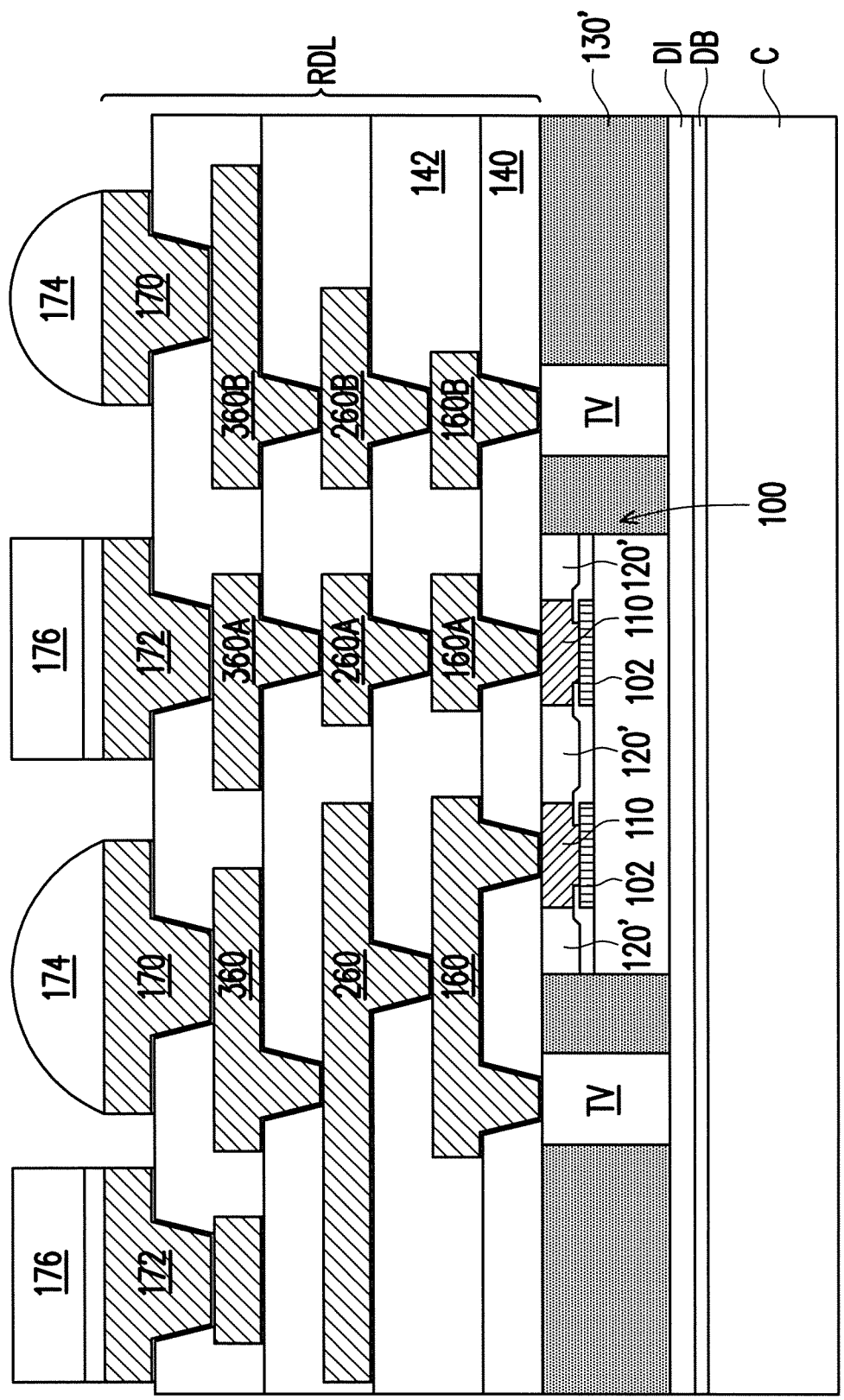

Referring to FIG. 12, after the redistribution circuit structure RDL is formed, a plurality of conductive balls 174 are placed over the under-ball metallurgy patterns 170, and a plurality of passive components 176 are mounted over the connection pads 172. In some embodiments, the conductive balls 174 may be placed over the under-ball metallurgy patterns 170 by ball placement process, and the passive components 176 may be mounted over the connection pads 172 through reflow process. In some alternative embodiments, the passive components 176 may be replaced by other external components. It is noted that the electrical path between the conductive pillar 110 of the die 100 and the passive component 176 is short due to the conductive vias 160A, 260A, 360A and the passive component 176 are aligned with each other. Therefore, the better electrical characteristics of the passive components 176 are obtained.

Figure 13:
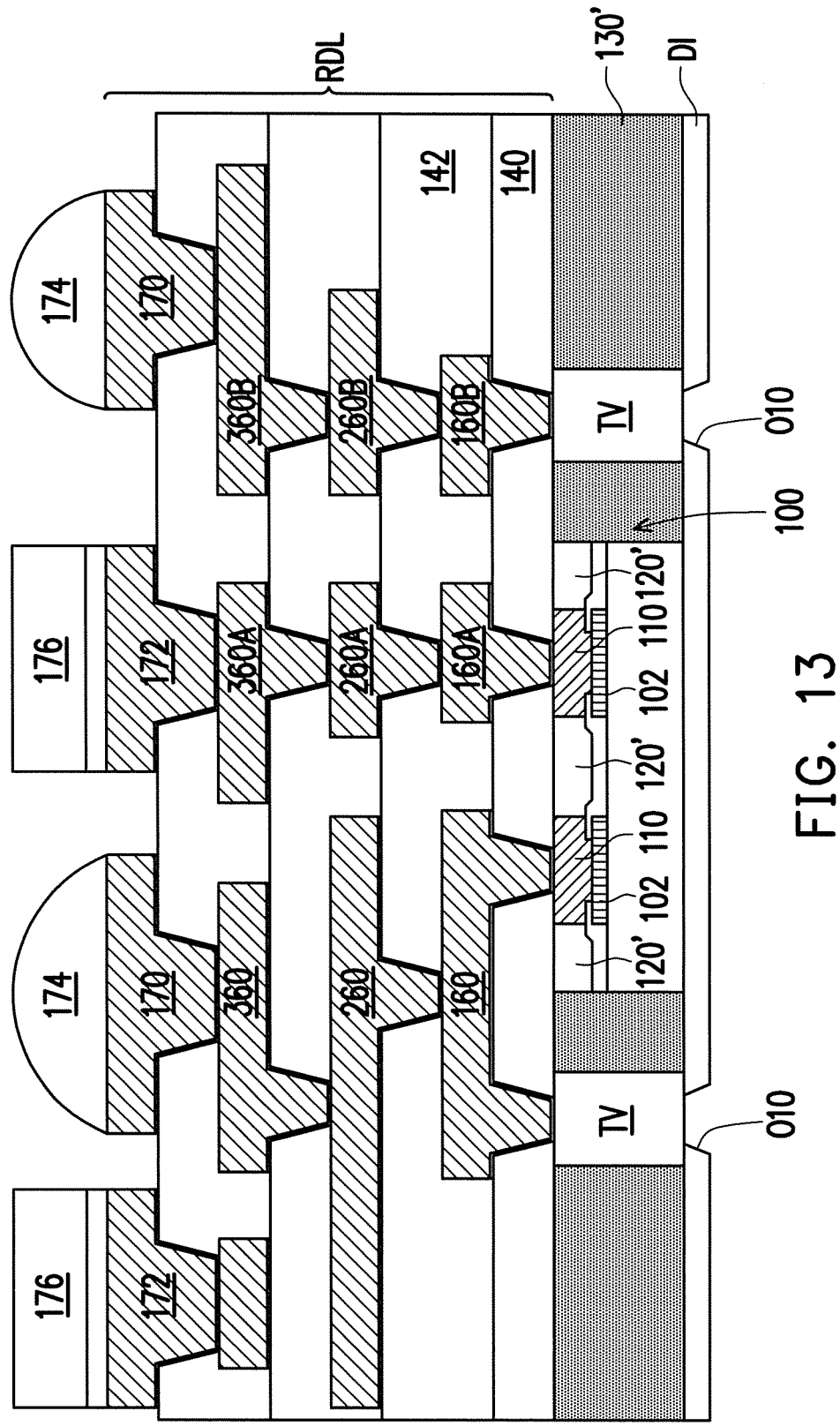

Referring to FIG. 12 and FIG. 13, after the conductive balls 174 and the passive components 176 are formed, the dielectric layer DI is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C. As shown in FIG. 13, the dielectric layer DI is then patterned such that a plurality of contact openings O10 are formed to expose the bottom surfaces of the conductive through vias TV. The number of the contact openings O10 is corresponding to the number of the conductive through vias TV.

Figure 14:
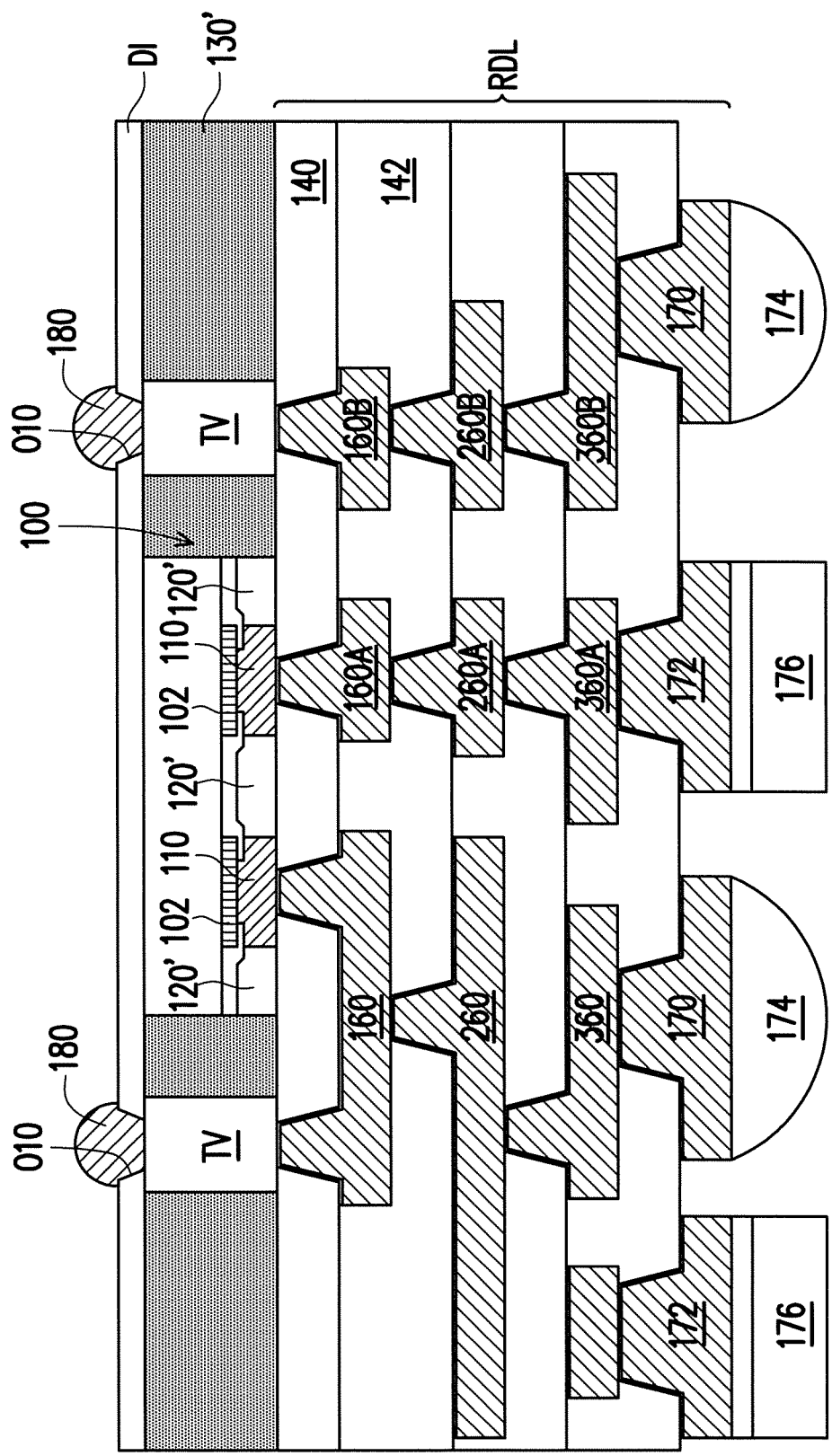

Referring to FIG. 14, after the contact openings O10 is formed in the dielectric layer DI, a plurality of conductive balls 180 are placed over the bottom surfaces of the conductive through vias TV that are exposed by the contact openings O10. Further, the conductive balls 180 are, for example, reflowed to bond with the bottom surfaces of the conductive through vias TV. As shown in FIG. 14, after the conductive balls 174 and the conductive balls 180 are formed, an integrated fan-out package of the die 100 having dual-side terminal is accomplished.

Figure 15:
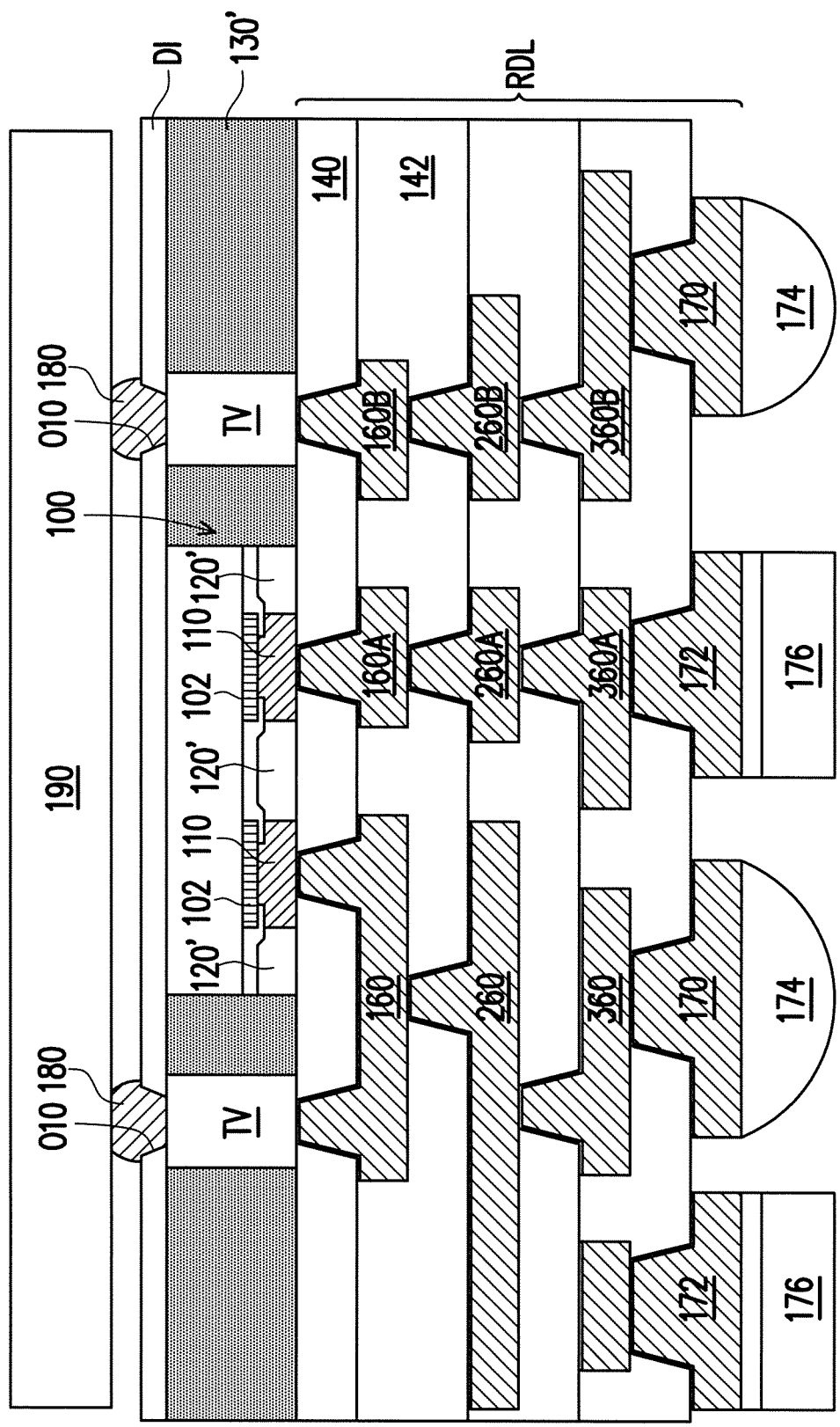

Referring to FIG. 15, another package 190 is then provided. In some embodiments, the package 190 is, for example, a memory device. The package 190 is stacked over and is electrically connected to the integrated fan-out package illustrated in FIG. 14 through the conductive balls 180 such that a package-on-package (POP) structure is fabricated.

In accordance with some embodiments of the present disclosure, a redistribution circuit structure electrically connected to a die underneath is provided. The redistribution circuit structure includes a dielectric layer and a conductive layer. The dielectric layer partially covers the die, so that a conductive pillar of the die is exposed by the dielectric layer. The conductive layer is disposed over the dielectric layer and electrically connected to the die through the conductive pillar of the die. The conductive layer includes a multilayer structure, and an average grain size of one layer of the multilayer structure is less than or equal to 2 μm.

In accordance with alternative embodiments of the present disclosure, an integrated fan-out package including a die, an insulating encapsulation, and a redistribution circuit structure. The die includes a conductive pillar. The die is encapsulated by the insulating encapsulation. The conductive pillar of the die is exposed by the insulating encapsulation. The redistribution circuit structure is disposed over the die and the insulating encapsulation. The redistribution circuit structure is electrically connected to the conductive pillar of the die. The redistribution circuit structure includes a dielectric layer and a plurality of conductive layers. The dielectric layer partially covers the insulating encapsulation and partially covers the die, so that a portion of the conductive pillar of the die is exposed by the dielectric layer. The conductive layers are disposed over the dielectric layer and electrically connected to the die through the conductive pillar of the die. One of the conductive layers includes at least two layers, and an average grain size of a top layer of the at least two layers is greater than an average grain size of a bottom layer of the at least two layers.

In accordance with yet alternative embodiments of the present disclosure, a method of fabricating a redistribution circuit structure electrically connected to a die underneath is provided. The method includes the following steps. A first dielectric layer is formed to partially cover the die. The first dielectric layer includes a first via hole exposing a conductive pillar of the die. A first seed layer is formed over the first dielectric layer. The first seed layer covers the first via hole and the conductive pillar of the die. A first photoresist pattern is formed over the first seed layer. The first photoresist pattern includes a first photoresist opening corresponding to the first via hole. A first plating process is performed to form a first conductive layer in the first via hole and the first photoresist opening. The first conductive layer is electrically connected to the die through the conductive pillar. The first conductive layer includes a multilayer structure. An average grain size of one layer of the multilayer structure is less than or equal to 2 μm. The first photoresist pattern is removed. The first seed layer uncovered by the first conductive layer is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A redistribution circuit structure electrically connected to a die underneath the redistribution circuit structure comprising:
    a dielectric layer partially covering the die, so that a conductive pillar of the die is exposed by the dielectric layer; and
    a conductive layer disposed over the dielectric layer and electrically connected to the die through the conductive pillar, wherein the conductive layer comprises a multilayer structure, and an average grain size of one layer of the multilayer structure is less than or equal to 2 μm, wherein the conductive layer comprises a conductive via, and the conductive via comprises:
        a main body portion comprising a first portion in the dielectric layer and a second portion on the first portion; and
        a sidewall portion, disposed over the dielectric layer and laterally aside and connected to the second portion of the main body portion, wherein an average grain size of the main body portion is greater than an average grain size of the sidewall portion.

2. The redistribution circuit structure of claim 1, wherein the average grain size of the main body portion is in a range of 1.5 μm to 2 μm and the average grain size of the sidewall portion is in a range of 0.8 μm to 1.2 μm.

3. The redistribution circuit structure of claim 1, wherein a thickness of one layer of the multilayer structure at the main body portion is greater than a thickness of the one layer of the multilayer structure at the sidewall portion.

4. The redistribution circuit structure of claim 1, wherein a top surface of the main body portion is coplanar with or lower than a top surface of the sidewall portion.

5. The redistribution circuit structure of claim 1, wherein the multilayer structure comprises a plurality of conductive sublayers and a plurality of interlayers, and the conductive sublayers and the interlayers are stacked alternately.

6. The redistribution circuit structure of claim 1, wherein the number of the conductive layer is plural, and a plurality of conductive layers are stacked alternately in the dielectric layer.

7. The redistribution circuit structure of claim 6, wherein a topmost conductive layer of the conductive layers is under-ball metallurgy (UBM) layer for electrically connecting to a passive component or an external component.

8. The redistribution circuit structure of claim 6, wherein an average grain size of one conductive layer is less than an average grain size of another conductive layer higher than the one conductive layer with respect to a direction perpendicular to a top surface of the conductive pillar of the die.

9. The redistribution circuit structure of claim 6, wherein an average grain size distribution of the conductive layers gradually increases from a bottommost conductive layer to a topmost conductive layer with respect to a direction perpendicular to a top surface of the conductive pillar of the die.

10. An integrated fan-out package, comprising:
    a die comprising a conductive pillar;
    an insulating encapsulation encapsulating the die, the conductive pillar of the die exposed by the insulating encapsulation; and
    a redistribution circuit structure disposed over the die and the insulating encapsulation, the redistribution circuit structure electrically connected to the conductive pillar of the die, the redistribution circuit structure comprising:
        a dielectric layer covering the insulating encapsulation and partially covering the die, so that a portion of the conductive pillar of the die is exposed by the dielectric layer;
        a seed layer on the dielectric layer; and
        a plurality of conductive layers disposed over the seed layer and the dielectric layer and electrically connected to the die by the conductive pillar of the die, wherein one of the plurality of conductive layers comprises at least two layers, and an average grain size of a top layer of the at least two layers is greater than an average grain size of a bottom layer of the at least two layers,
        wherein an average grain size of a lower conductive layer of the plurality of conductive layers is less than an average grain size of an upper conductive layer of the plurality of conductive layers.

11. The integrated fan-out package of claim 10, wherein the conductive layer comprises a conductive via, and the conductive via comprises:
    a main body portion comprising a first portion in the dielectric layer and a second portion on the first portion; and
    a sidewall portion, disposed over the dielectric layer and laterally aside and connected to the second portion of the main body portion, wherein an average grain size of the main body portion is greater than an average grain size of the sidewall portion.

12. The integrated fan-out package of claim 11, wherein a thickness of one layer of the at least two layers at the main body portion is greater than a thickness of one layer of the multilayer structure at the sidewall portion.

13. The integrated fan-out package of claim 11, wherein one of the plurality of conductive layers has a multilayer structure, and the multilayer structure comprises a plurality of conductive sublayers and a plurality of interlayers, the conductive sublayers and the interlayers are stacked alternately.

14. The integrated fan-out package of claim 13, wherein an average grain size of the plurality of conductive sublayers is less than or equal to 2 μm.

15. A method of fabricating a redistribution circuit structure electrically connected to a die underneath the redistribution circuit structure, the method comprising:

forming a first dielectric layer to partially cover the die, the first dielectric layer comprising a first via hole exposing a conductive pillar of the die;

forming a first seed layer over the first dielectric layer, the first seed layer covering the first via hole and the conductive pillar of the die;

forming a first photoresist pattern over the first seed layer, the first photoresist pattern comprising a first photoresist opening corresponding to the first via hole;

performing a first plating process to form a first conductive layer in the first via hole and the first photoresist opening, the first conductive layer electrically connected to the die through the conductive pillar, the first conductive layer comprising a multilayer structure, wherein an average grain size of one layer of the multilayer structure is less than or equal to 2 μm;

removing the first photoresist pattern; and removing the first seed layer uncovered by the first conductive layer, wherein the first conductive layer comprises a conductive via, and the conductive via comprises:

a main body portion comprising a first portion in the dielectric layer and a second portion on the first portion; and a sidewall portion, disposed over the dielectric layer and laterally aside and connected to the second portion of the main body portion, wherein an average grain size of the main body portion is greater than an average grain size of the sidewall portion.

16. The method of claim 15, wherein a plating density of the first plating process is in a range of 0.5 ASD to 2 ASD.

17. The method of claim 15, wherein a local current density at a center region of the first via hole is higher than a local current density at an edge region of the first via hole during the first plating process, so that the average grain size of the main body portion is greater than the average grain size of the sidewall portion.

18. The method of claim 15, after removing the first seed layer uncovered by the first conductive layer, further comprising following steps:

forming a second dielectric layer over the first dielectric layer and the first conductive layer, the second dielectric layer comprising a second via hole to expose a portion of a top surface of the first conductive layer;

forming a second seed layer over the second dielectric layer, the second seed layer covering the second via hole and the portion of the top surface of the first conductive layer;

forming a second photoresist pattern over the second seed layer, the second photoresist pattern comprising a second photoresist opening corresponding to the second via hole;

performing a second plating process to form a second conductive layer in the second via hole and second photoresist opening, the second conductive layer electrically connecting with the first conductive layer;

removing the second photoresist pattern;

removing the second seed layer uncovered by the second conductive layer; and repeating the steps to form a plurality of conductive layers stacked alternately.

19. The method of claim 18, wherein a plating density of the second plating process is greater than or equal to a plating density of the first plating process.

* * * * *